United States Patent
Kawano et al.

(10) Patent No.: US 9,087,762 B2
(45) Date of Patent: Jul. 21, 2015

(54) METHOD FOR MANUFACTURING SEMICONDUCTOR DEVICE

(71) Applicant: CANON KABUSHIKI KAISHA, Tokyo (JP)

(72) Inventors: Akihiro Kawano, Kawasaki (JP); Hiroaki Sano, Chofu (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/554,311

(22) Filed: Nov. 26, 2014

(65) Prior Publication Data

US 2015/0171137 A1 Jun. 18, 2015

(30) Foreign Application Priority Data

Dec. 18, 2013 (JP) .................................. 2013-261837
Nov. 10, 2014 (JP) .................................. 2014-228330

(51) Int. Cl.
*H01L 21/00* (2006.01)
*H01L 27/146* (2006.01)

(52) U.S. Cl.
CPC ................................ *H01L 27/14698* (2013.01)

(58) Field of Classification Search
CPC ............ H01L 2924/00; H01L 29/66969; H01L 2224/48091; H01L 23/528; H01L 27/0207; H01L 2924/0002; H01L 2924/1306; H01L 21/76802; H01L 23/34; H01L 23/481; H01L 24/83; H01L 27/1104; H01L 27/14609
USPC ............ 257/97, 532, 751, E23.141, E21.495; 438/296, 399, 637, 660
See application file for complete search history.

(56) References Cited

U.S. PATENT DOCUMENTS

| | | | |
|---|---|---|---|
| 7,199,043 | B2 | 4/2007 | Park |
| 7,670,941 | B2 | 3/2010 | Kawanami et al. |
| 2004/0082163 | A1* | 4/2004 | Mori et al. ............... 438/630 |
| 2011/0291295 | A1 | 12/2011 | Isa et al. |

FOREIGN PATENT DOCUMENTS

| | | |
|---|---|---|
| JP | 2001-160590 A | 6/2001 |
| JP | 2005-033164 A | 2/2005 |
| JP | 2007-067132 A | 3/2007 |
| JP | 2011-249582 A | 12/2011 |

* cited by examiner

*Primary Examiner* — Mark A Laurenzi
(74) *Attorney, Agent, or Firm* — Fitzpatrick, Cella, Harper & Scinto

(57) ABSTRACT

A method for manufacturing a semiconductor device is provided. The method includes forming a wiring pattern made of copper, annealing the wiring pattern in an atmosphere of inert gas, and performing plasma processing on the wiring pattern using a reducing gas after the annealing. A temperature in the plasma processing is equal to or below a temperature in the annealing.

11 Claims, 5 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device.

2. Description of the Related Art

In recent years, there are cases where copper (Cu) is used as a material for wiring patterns to form fine wiring patterns in semiconductor devices. When a wiring pattern is formed using copper, a hillock may be produced in the wiring pattern. Japanese Patent Laid-Open No. 2011-249582 proposes a method of reducing hillocks by annealing after plating processing and CMP for forming a wiring pattern.

SUMMARY OF THE INVENTION

As will be described later, annealing alone after CMP processing cannot sufficiently reduce hillocks that have occurred in the wiring pattern. An aspect of the present invention provides a technique for reducing hillocks that occur in the wiring pattern.

According to some embodiments, a method for manufacturing a semiconductor device is provided. The method includes forming a wiring pattern made of copper, annealing the wiring pattern in an atmosphere of inert gas, and performing plasma processing on the wiring pattern using a reducing gas after the annealing. A temperature in the plasma processing is equal to or below a temperature in the annealing.

Further features of the present invention will become apparent from the following description of exemplary embodiments (with reference to the attached drawings).

DESCRIPTION OF THE EMBODIMENTS

Figure 1A:
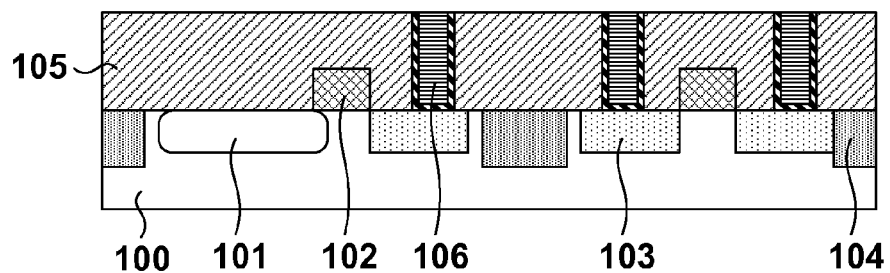
FIGS. 1A to 1D illustrate a method for manufacturing a solid-state imaging apparatus according to some embodiments.

Hereinafter, embodiments of the present invention will be described with reference to the accompanying drawings. Throughout various embodiments, the same elements will be assigned the same reference numerals and overlapping description will be omitted. The respective embodiments can be modified or combined as appropriate. The present invention is generally applicable to a method for manufacturing a semiconductor device including a solid-state imaging apparatus, a processing apparatus and a memory apparatus or the like. A solid-state imaging apparatus will be described hereinafter as an example of the semiconductor device. Regarding a general technique relating to a method for manufacturing a solid-state imaging apparatus, existing techniques can be used, and therefore details thereof may be omitted below.

A method for manufacturing a solid-state imaging apparatus according to some embodiments will be described with reference to FIG. 1A to FIG. 4B. First, as shown in FIG. 1A, a semiconductor substrate 100 is prepared in which a photoelectric conversion element or transistor is formed. The semiconductor substrate 100 includes a semiconductor region 101 which accumulates charge generated in accordance with a light quantity of incident light upon the solid-state imaging apparatus, and this semiconductor region 101 constitutes the photoelectric conversion element. The semiconductor substrate 100 also includes a semiconductor region 103 that makes up a source or drain of a transistor and an element isolation region 104 for isolating a circuit element such as the semiconductor region 101 which is a photoelectric conversion element. A gate electrode 102 is formed on a surface of the semiconductor substrate 100. After that, an insulating film 105 is formed on the semiconductor substrate 100. The insulating film 105 functions as an interlayer insulating film. The insulating film 105 is formed, for example, of SiN, NSG, BPSG or $SiO_2$. The insulating film 105 may have a laminated structure including a plurality of insulating films. After that, a contact plug 106 which penetrates the insulating film 105 is formed. The contact plug 106 is formed, for example, of tungsten. A barrier metal layer may also be formed between the contact plug 106 and the insulating film 105. The structure shown in FIG. 1A is formed in this way.

Figure 1B:
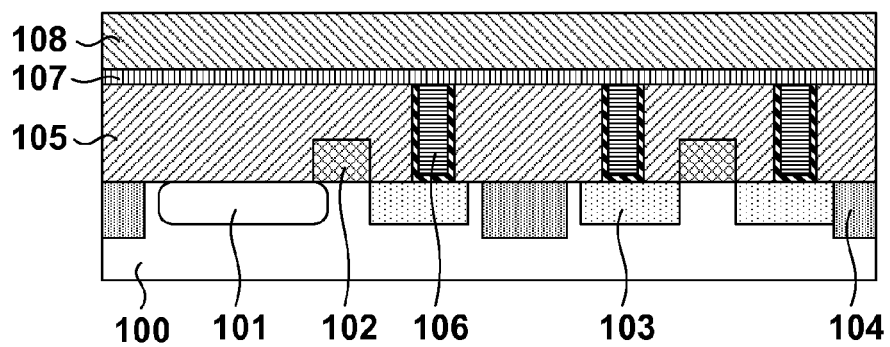

Next, as shown in FIG. 1B, an insulating film 107 and an insulating film 108 are formed in that order on the insulating film 105. The insulating film 107 functions as an etching stop layer when etching the insulating film 108 in steps which will be described later. The insulating film 107 is formed of a material such as SiN or SiC using a plasma CVD method. Instead of this, the insulating film 107 may also be formed of a low-k material using an SoG method. The insulating film 108 functions as an interlayer insulating film. The insulating film 108 is formed of a material such as SiO or SiOC using a plasma CVD method.

Figure 1C:
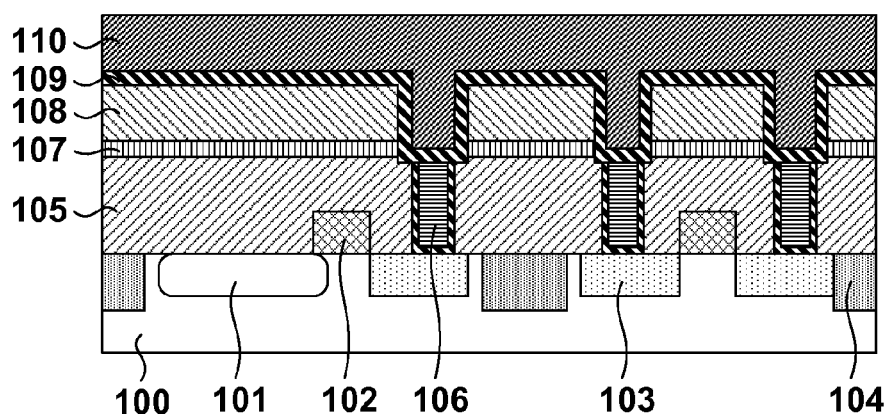

Next, as shown in FIG. 1C, an opening which penetrates the insulating film 107 and the insulating film 108 is formed. This opening has a shape of a wiring pattern. Part of this opening exposes a top surface of the contact plug 106. The opening is formed, for example, by forming a photoresist pattern on the insulating film 108 and performing etching using the photoresist pattern as a mask. Etching is, for example, anisotropic etching. In this etching, the insulating film 107 functions as an etching stop layer. After performing etching up to the insulating film 107, the insulating film 107 is etched under a condition changed to one with a higher etching rate for the insulating film 107 to expose a top surface of the contact plug 106.

Next, a metal film 109 is formed from above the insulating film 108 using, for example, a sputtering method. Some parts of the metal film 109 are embedded into the openings of the insulating film 107 and insulating film 108. The metal film 109 functions as a copper anti-diffusion film. That is, the metal film 109 prevents copper which will be used in subsequent steps from being diffused into the layer beneath the metal film 109. The metal film 109 is formed, for example, of Ta or Ti. Next, a conductive film 110 is formed from above the metal film 109 using an electrically conductive member whose principal ingredient is copper as material. Some parts of the conductive film 110 are embedded into the openings of the insulating film 107 and insulating film 108. The conductive film 110 is formed using, for example, an electric field plating method. The conductive film 110 has a thickness of about 1000 nm. After the conductive film 110 is formed, the conductive film 110 is subjected to annealing at about 150° C.

Figure 1D:
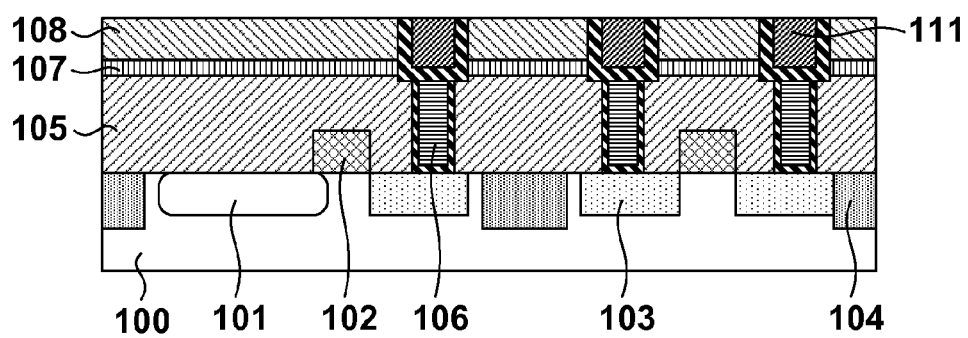

Next, as shown in FIG. 1D, portions of the metal film 109 and the conductive film 110 located on the insulating film 108 are removed using chemical-mechanical polishing (CMP). The remaining portions which have not been removed of the conductive film 110 become a wiring pattern 111. This CMP is continued until the thickness of the wiring pattern 111 falls to or below 3000 Å. An abrasive (slurry) used in CMP contains benzotriazole (BTA) as a corrosion inhibitor of copper. For this reason, BTA is coupled to the surface of the wiring pattern 111 after CMP. Part of the wiring pattern 111 is oxidized, and CuO and $CuO_2$ are formed.

Next, the wiring pattern 111 is subjected to annealing. This annealing is performed using, for example, a single wafer processing type annealing apparatus in an atmosphere of inert gas (Ar, $N_2$, He, Ne, Kr or the like) at a temperature of 300 to 400° C. for about 120 seconds. The temperature in this annealing may be equal to or higher than a temperature when forming an insulating film 201 which will be described later. Here, Ar or $N_2$ may also be used as the inert gas.

Next, the wiring pattern 111 is subjected to plasma processing (plasma irradiation) using a reducing gas. The BTA or copper oxide on the surface of the wiring pattern 111 is removed by this plasma processing. The reducing gas contains, for example, $H_2$ or $NH_3$. The plasma processing is performed at a temperature of 200 to 400° C. for about 15 seconds. By removing the BTA or copper oxide from the wiring pattern 111, it is possible to improve the adherence between the wiring pattern 111 and the insulating film 201 which will be described later. Since the heat by plasma irradiation has a high temperature, the plasma processing time may be minimized. The temperature in this plasma processing may be equal to or lower than the temperature of annealing. Performing plasma processing at a temperature equal to or lower than the temperature of annealing prevents crystal of the metal film 109 which is stable during annealing from changing (abnormal growth or the like).

Figure 2A:
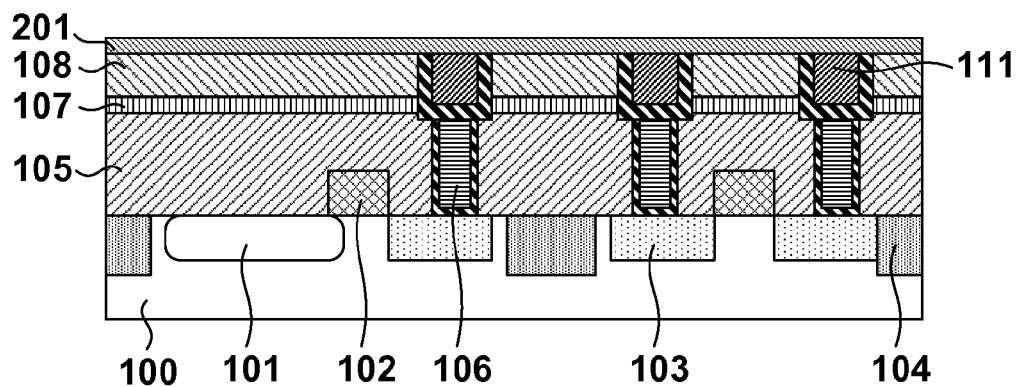
FIGS. 2A to 2C illustrate a method for manufacturing a solid-state imaging apparatus according to some embodiments.

Next, as shown in FIG. 2A, an insulating film 201 is formed on the insulating film 108 and the wiring pattern 111. The insulating film 201 functions as a copper anti-diffusion film. That is, the insulating film 201 prevents copper of the wiring pattern 111 from being diffused into layers on or above the insulating film 201. The insulating film 201 is formed using any one of SiN, SiC and SiON as material using a plasma CVD method. These exemplary materials of the insulating film 201 may include a bit of oxygen such as SiCO or have different coupling such as SiNO. This insulating film 201 is formed at a temperature of 200 to 350° C. As described above, the temperature when forming the insulating film 201 may be equal to or lower than the temperature of annealing. Forming the insulating film 201 at a temperature equal to or lower than the temperature of annealing restrains the crystal of the metal film 109 which is stable during annealing from changing (abnormal growth or the like) in annealing. The thickness of the insulating film 201 is, for example, about 700 Å. The insulating film 201 may be formed in two or more chambers as a film about several hundreds of Å divisionally in a plurality of steps. Even if pin holes are produced due to abnormalities in the film each time, forming the insulating film 201 in this way can restrain pin holes from being produced in the insulating film 201 as a whole.

Figure 2B:
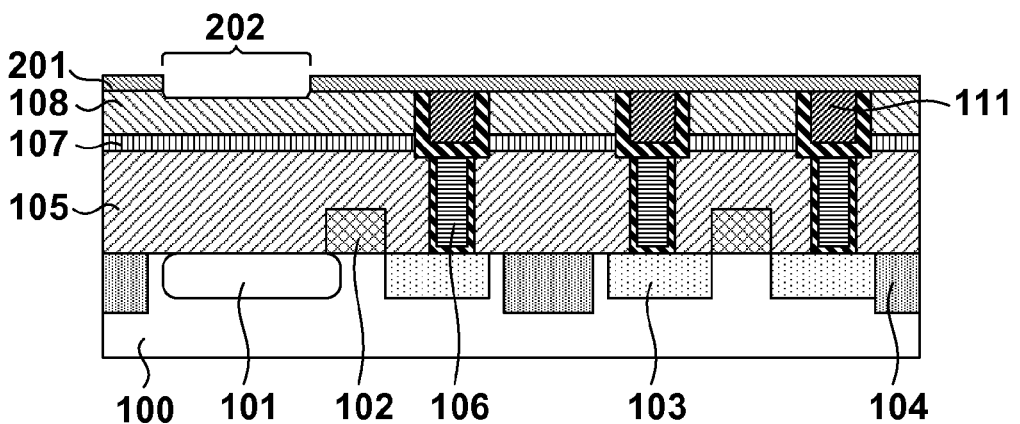

Next, as shown in FIG. 2B, a portion of the insulating film 201 on the semiconductor region 101 is removed and an opening 202 is formed in the insulating film 201. The opening 202 is formed by, for example, forming a photoresist pattern on the insulating film 201 and performing etching using the photoresist pattern as a mask. When the insulating film 107 contains a material that affects optical characteristics, this etching may be performed until the portion of the insulating film 107 located on the semiconductor region 101 is removed.

Figure 2C:
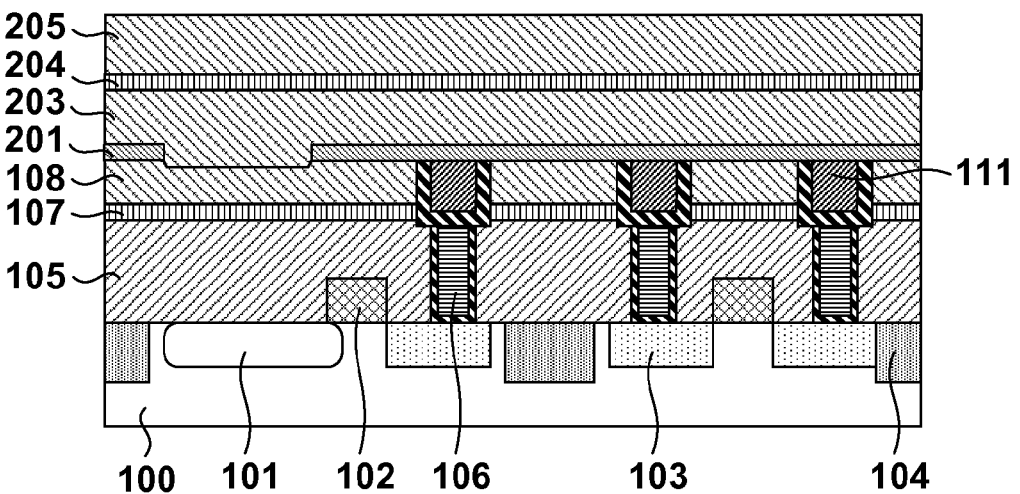

Next, as shown in FIG. 2C, an insulating film 203, an insulating film 204 and an insulating film 205 are formed in that order on the insulating film 201. The insulating film 203 and the insulating film 205 function as interlayer insulating films. The insulating film 203 and the insulating film 205 are formed using, for example, SiO or SiOC as material using a plasma CVD method. The insulating film 204 functions as an etching stop layer when etching the insulating film 108 in steps which will be described later. The insulating film 204 is formed using, for example, SiN or SiC as material using a plasma CVD method. Instead of this, the insulating film 204 may also be formed of a low-k material using an SoG method.

Figure 3A:
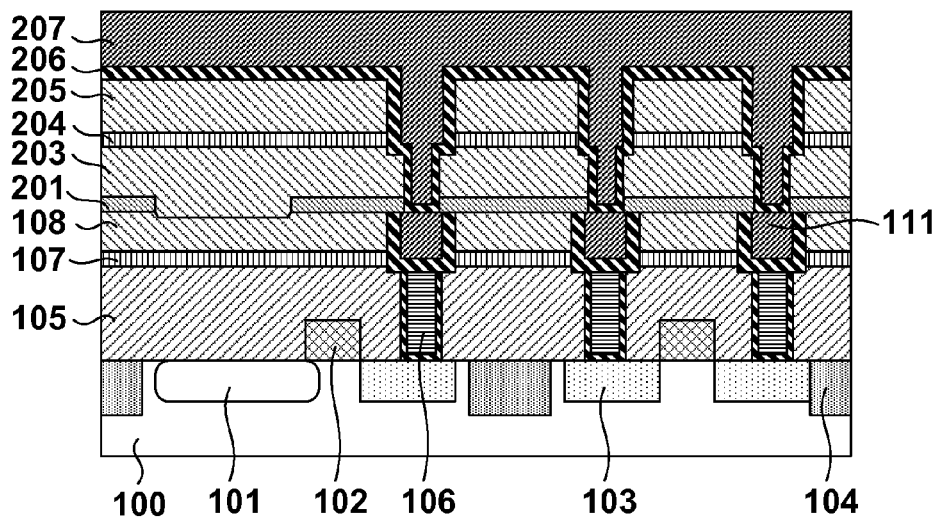
FIGS. 3A to 3C illustrate a method for manufacturing a solid-state imaging apparatus according to some embodiments.

Next, as shown in FIG. 3A, openings are formed which penetrate the insulating film 201, insulating film 203, insulating film 204 and insulating film 205. The opening that penetrates the insulating film 201 and insulating film 203 has a shape of via plug connected to the wiring pattern 111 and the opening that penetrates the insulating film 204 and insulating film 205 has a shape of a wiring pattern. This opening is formed, for example, by forming a photoresist pattern on the insulating film 205 and performing etching using this photoresist pattern as a mask. The etching is, for example, anisotropic etching. In this etching, the insulating film 204 functions as an etching stop layer. After that etching, penetrating openings are formed by etching the insulating film 204.

Next, a metal film 206 is formed from above the insulating film 205 using, for example, a sputtering method. Some parts of the metal film 206 are embedded into the openings of the insulating film 201, insulating film 203, insulating film 204 and insulating film 205. The metal film 206 functions as a copper anti-diffusion film. That is, the metal film 206 prevents copper to be used in subsequent steps from being diffused into layers below the metal film 206. The metal film 206 is formed, for example, of Ta or Ti. Next, a conductive film 207 made of an electrically conductive member whose principal ingredient is copper is formed from above the metal film 206. Some parts of the conductive film 207 are embedded into the openings of the insulating film 201, insulating film 203, insulating film 204 and insulating film 205. The conductive film 207 is formed using, for example, an electric field plating method. The thickness of the conductive film 207 is about 1000 nm. After forming the conductive film 207, the conductive film 207 is subjected to annealing at about 150° C.

Figure 3B:
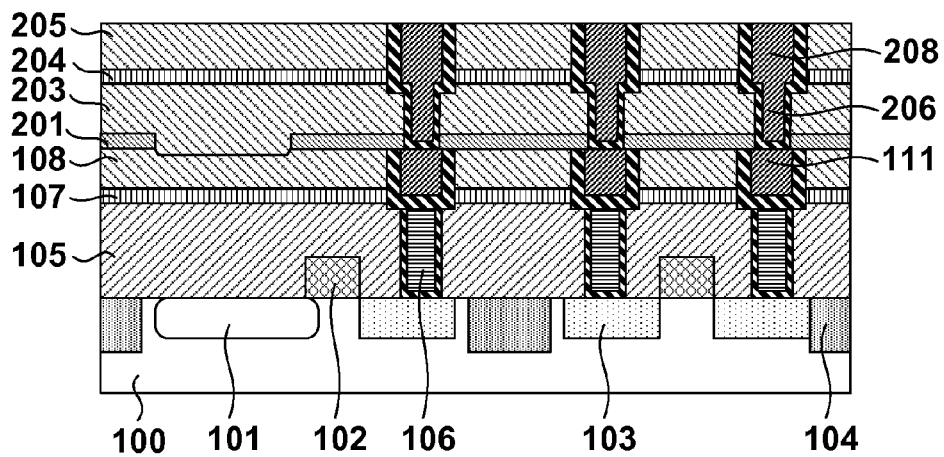

Next, portions of the metal film 206 and the conductive film 207 located on the insulating film 205 are removed using CMP as shown in FIG. 3B. The remaining portions which have not been removed of the conductive film 207 become a wiring pattern 208. This CMP is continued until the thickness of the wiring pattern 208 becomes, for example, 3000 Å or below. The abrasive (slurry) used in the CMP contains BTA as a corrosion inhibitor of copper. For that reason, BTA is coupled to the surface of the wiring pattern 208 after the CMP. Part of the wiring pattern 208 is oxidized and CuO and/or $CuO_2$ are/is formed.

Next, the wiring pattern 208 is subjected to annealing. This annealing is performed using, for example, a single wafer processing type annealing apparatus in an inert gas atmosphere (Ar or $N_2$) at a temperature of 300 to 350° C. for about 120 seconds. The temperature in this annealing may be equal to or higher than a temperature when an insulating film 209 which will be described later is formed. Next, the wiring pattern 208 is subjected to plasma processing similar to that performed on the wiring pattern 111.

Figure 3C:
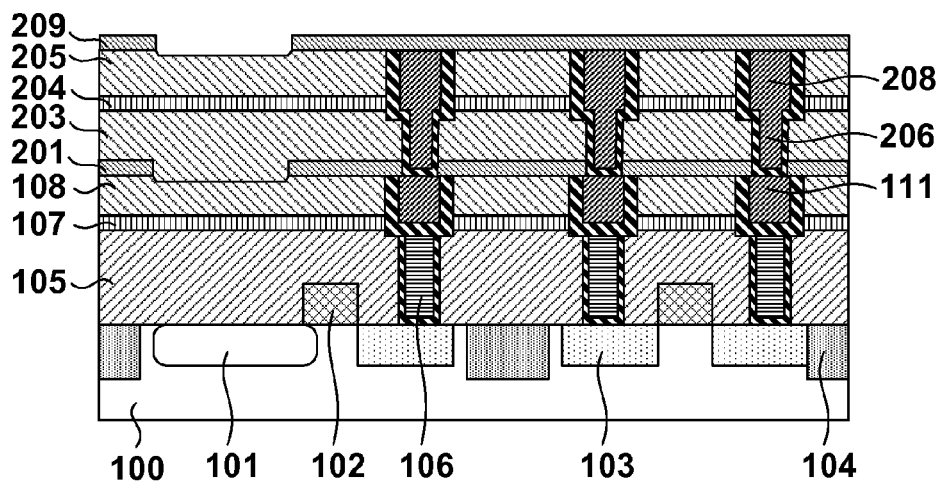

Next, as shown in FIG. 3C, the insulating film 209 is formed on the insulating film 205 and the wiring pattern 208. The insulating film 209 functions as a copper anti-diffusion film. That is, the insulating film 209 prevents copper of the wiring pattern 208 from being diffused into layers on or above the insulating film 209. The insulating film 209 is formed using any one of, for example, SiN, SiC and SiON as material using a plasma CVD method. The thickness of the insulating film 209 is, for example, about 700 Å. As with the aforementioned insulating film 201, the insulating film 209 may be formed in two or more chambers as a film about several hundreds of Å divisionally in a plurality of steps.

Next, a portion of the insulating film 209 located on the semiconductor region 101 is removed and an opening 202 is formed on the insulating film 209. The opening 202 is formed, for example, by forming a photoresist pattern on the insulating film 209 and performing etching using the insulating film 209 as a mask. When the insulating film 204 contains a material that affects optical characteristics, this etching may be performed until the portion of the insulating film 204 located on the semiconductor region 101 is removed.

Figure 4A:
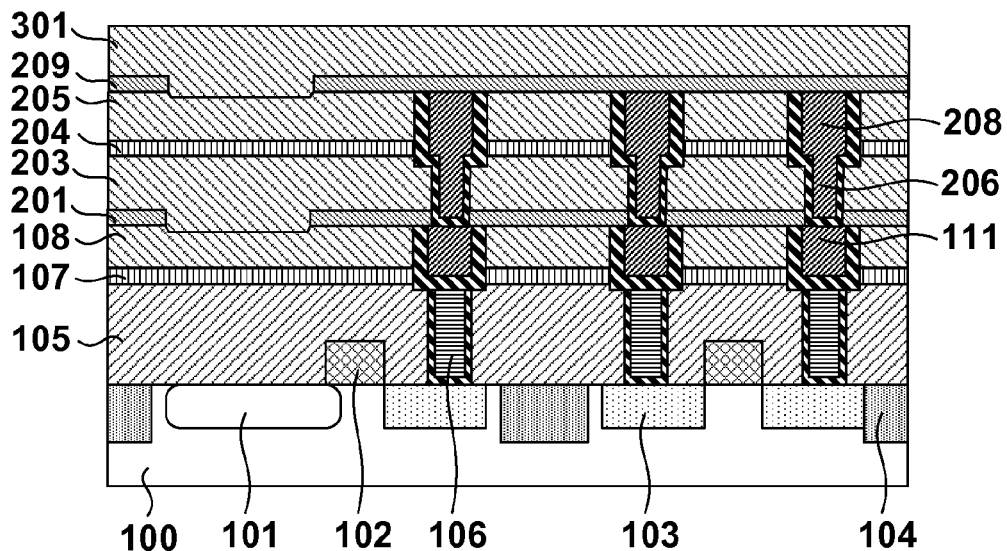
FIGS. 4A and 4B illustrate a method for manufacturing a solid-state imaging apparatus according to some embodiments.

Next, as shown in FIG. 4A, an insulating film 301 is formed on the insulating film 209. The insulating film 209 functions as an interlayer insulating film. The insulating film 209 is formed of, for example, $SiO_2$ as material using a plasma CVD method.

Figure 4B:
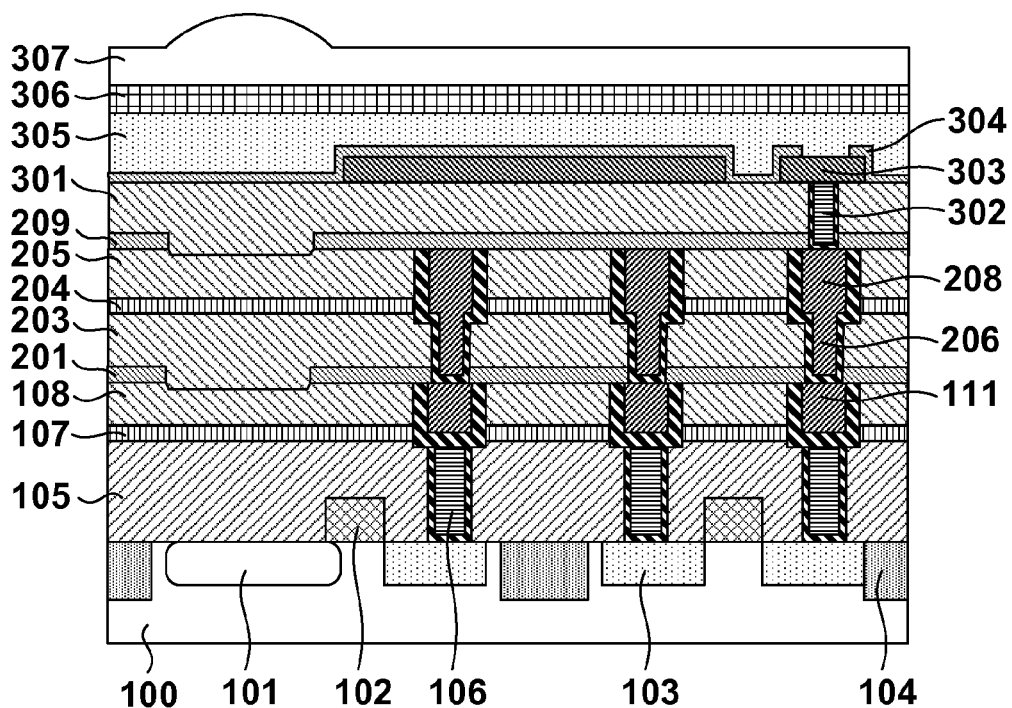

Next, as shown in FIG. 4B, a via plug 302 is formed. The via plug 302 is formed, for example, by embedding a tungsten film into the opening formed in the insulating film 301 and removing a superfluous portion using a CMP method or the like. Next, a wiring pattern 303 is formed on the insulating film 301. The wiring pattern 303 is formed, for example, through patterning. The wiring pattern 303 also functions as a light-shielding film of a peripheral circuit region of the semiconductor substrate 100. When the peripheral circuit region in the solid-state imaging apparatus is covered with a light-shielding film, the width of the light-shielding film is 10 μm or above. For that reason, when the light-shielding film is formed of copper, dishing may occur, causing uniformity of the light-shielding film and light-shielding properties to deteriorate. Thus, in the present embodiment, the wiring pattern 303 that functions as a light-shielding film is made of a conductive material whose principal ingredient is aluminum. Next, an insulating film 304 is formed on the wiring pattern 303. The insulating film 304 is formed of, for example, SiN or SiON as material using a plasma CVD method. The insulating film 304 may also have a laminated structure. The insulating film 304 has an opening in a region corresponding to an input pad or output pad. Next, a planarizing layer 305 made of resin, a color filter layer 306 including a color filter, and a micro lens layer 307 including a micro lens are formed in that order. The solid-state imaging apparatus is manufactured in the steps described so far.

Figure 5:
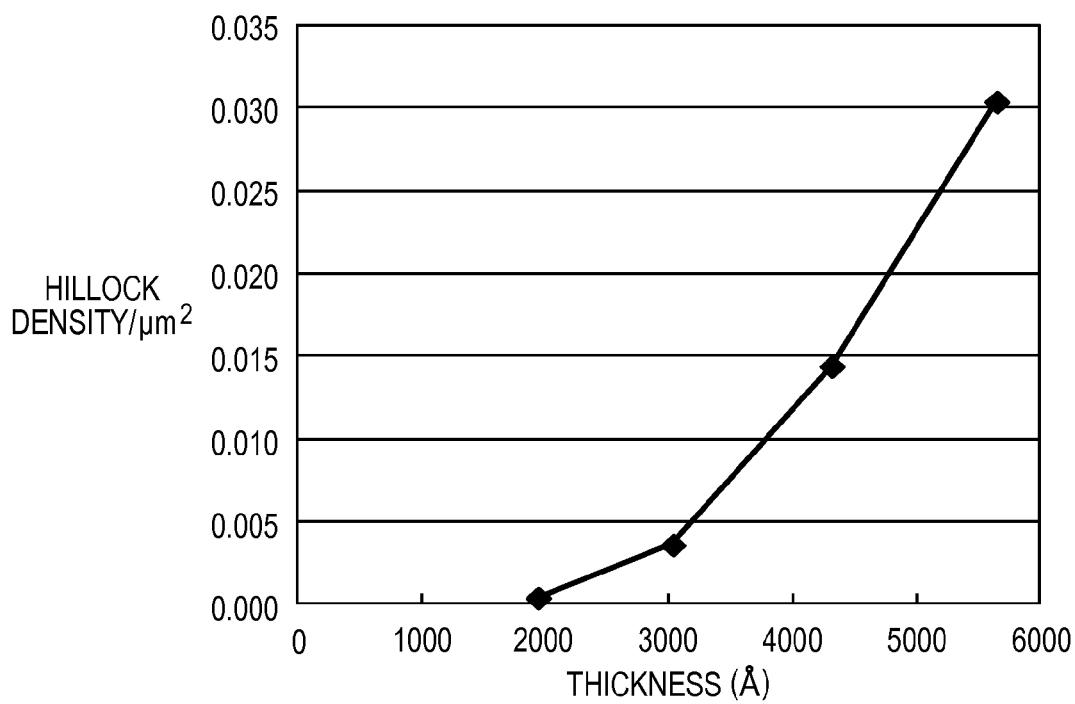
FIG. 5 is a diagram illustrating a relationship between a thickness of a wiring pattern and a hillock density.

With reference to FIG. 5, a relationship between a thickness of the aforementioned wiring pattern 111 and a hillock density will be described. A graph in FIG. 5 shows measurement results of the hillock density when the thickness of the wiring pattern 111 is changed in the aforementioned manufacturing method. In this measurement, a diameter of the semiconductor substrate 100 is assumed to be 200 mm, the wiring pattern 111 is subjected to plasma processing using a reducing gas containing $NH_3$, and SiN is used as the material of the insulating film 201. Under this condition, the hillock density of the wiring pattern 111 after forming the insulating film 201 is measured. As is observed from FIG. 5, the greater the thickness of the wiring pattern 111, the higher is the hillock density as well, and the greater the change rate (gradient of the graph) of the hillock density also becomes. This may suggest that the greater the thickness of the copper film, the greater the growth of a copper crystal due to heat generated in the plasma processing or plasma CVD processing, causing the copper extruded onto the surface of the wiring pattern 111 to become a hillock. Thus, as described above, in some embodiments, the thickness of the wiring pattern 111 is assumed to be 3000 Å or below. The relationship in FIG. 5 also holds for the wiring pattern 208.

Figure 6:
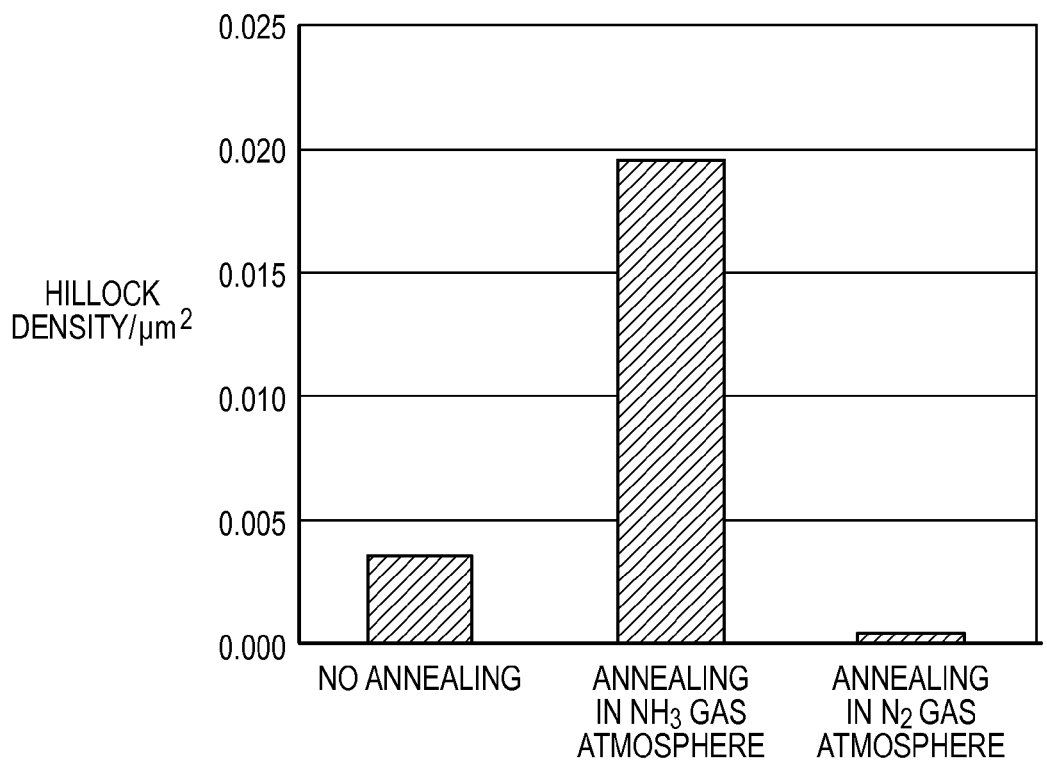
FIG. 6 is a diagram illustrating a relationship between annealing and a hillock density.

With reference to FIG. 6, a relationship between annealing on the aforementioned wiring pattern 111 and the hillock density will be described. A graph in FIG. 6 illustrates measurement results of the hillock density in the aforementioned manufacturing method when annealing is not performed in an inert gas atmosphere, when $NH_3$ is used as the inert gas and when $N_2$ is used as the inert gas. This measurement assumes that the diameter of the semiconductor substrate 100 is 200 mm, the thickness of the wiring pattern 111 is 3000 Å, the wiring pattern 111 is subjected to plasma processing using a reducing gas containing $NH_3$, and SiN is used as the material of the insulating film 201. Under this condition, the hillock density of the wiring pattern 111 after forming the insulating film 201 was measured. When performing annealing, annealing was performed at 350° C. for 120 seconds. As is observed from FIG. 6, in the case of the $NH_3$ gas, the hillock density is higher than when annealing is not performed, but in the case of the $N_2$ gas, the hillock density is lower than when annealing is not performed. This may suggest that the $NH_3$ gas reduced CuO and/or $CuO_2$ on the copper surface, making the copper crystal on the copper surface more likely to grow and thereby producing a hillock. When Ar was used as the inert gas, the hillock density decreased more than when annealing was not performed. The relationship in FIG. 6 holds for the wiring pattern 208 as well.

In the aforementioned manufacturing method, the wiring pattern 111 was formed using a single damascene method and the wiring pattern 208 was formed using a dual damascene method. In another embodiment, both the wiring pattern 111 and the wiring pattern 208 may be formed using the aforementioned single damascene method or using the aforementioned dual damascene method. When the solid-state imaging apparatus includes a plurality of wiring patterns, only some parts of the wiring patterns may be subjected to the aforementioned annealing in an inert gas atmosphere.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2013-261837, filed Dec. 18, 2013, and 2014-228330, filed Nov. 10, 2014, which are hereby incorporated by reference herein in their entirety.

What is claimed is:

1. A method for manufacturing a semiconductor device, the method comprising:
   forming a wiring pattern made of copper;
   annealing the wiring pattern in an atmosphere of inert gas; and
   performing plasma processing on the wiring pattern using a reducing gas after the annealing,
      wherein a temperature in the plasma processing is equal to or below a temperature in the annealing, and
      wherein the forming of the wiring pattern comprises:

forming an electrically conductive film using copper as a material on a first insulating film having an opening and in the opening; and polishing the conductive film to remove a portion of the conductive film located on the first insulating film, wherein a portion of the conductive film embedded in the opening of the first insulating film becomes the wiring pattern.

2. The manufacturing method according to claim 1, wherein the conductive film is formed using a plating method.

3. The manufacturing method according to claim 1, wherein the first insulating film is polished using CMP.

4. The manufacturing method according to claim 1, further comprising forming a second insulating film that covers a top surface of the wiring pattern, wherein a temperature when forming the second insulating film is equal to or below the temperature in the annealing.

5. The manufacturing method according to claim 4, wherein the second insulating film contains at least one of SiN, SiC and SiON.

6. The manufacturing method according to claim 4, wherein the second insulating film is formed in two or more chambers divisionally in a plurality of steps.

7. The manufacturing method according to claim 4, wherein the semiconductor device is a solid-state imaging apparatus comprising a photoelectric conversion element, and wherein the manufacturing method further comprises removing a portion of the second insulating film located over the photoelectric conversion element.

8. The manufacturing method according to claim 1, wherein the reducing gas contains at least one of $H_2$ and $NH_3$.

9. The manufacturing method according to claim 1, wherein the inert gas is $N_2$ or Ar.

10. The manufacturing method according to claim 1, wherein the wiring pattern has a thickness of 3000 Å or below.

11. A method for manufacturing a solid-state imaging apparatus comprising a photoelectric conversion element, the method comprising:

forming a wiring pattern made of copper;

annealing the wiring pattern in an atmosphere of inert gas;

performing plasma processing on the wiring pattern using a reducing gas after the annealing, forming a second insulating film that covers a top surface of the wiring pattern, and removing a portion of the second insulating film located over the photoelectric conversion element, wherein a temperature in the plasma processing is equal to or below a temperature in the annealing, and wherein a temperature when forming the second insulating film is equal to or below the temperature in the annealing.

* * * * *